(12) United States Patent
Kim

(10) Patent No.: US 7,368,931 B2
(45) Date of Patent: May 6, 2008

(54) ON-CHIP SELF TEST CIRCUIT AND SELF TEST METHOD FOR SIGNAL DISTORTION

(75) Inventor: Kyung-Hoon Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/143,491

(22) Filed: Jun. 3, 2005

(65) Prior Publication Data

US 2006/0152236 A1    Jul. 13, 2006

(30) Foreign Application Priority Data

Nov. 3, 2004    (KR) .................. 10-2004-0088841

(51) Int. Cl.
*G01R 31/02* (2006.01)
(52) U.S. Cl. ..................... 324/763; 714/733
(58) Field of Classification Search ................ 324/763, 324/765; 714/733, 734, 724
See application file for complete search history.

(56) References Cited

U.S. PATENT DOCUMENTS

| | | | |
|---|---|---|---|
| 4,001,818 A * | 1/1977 | Radichel et al. ............. | 340/520 |
| 5,099,196 A * | 3/1992 | Longwell et al. ............. | 324/537 |
| 5,396,500 A * | 3/1995 | Tanaka et al. ............... | 714/724 |
| 5,430,737 A * | 7/1995 | Yamashita et al. ........... | 714/736 |
| 5,457,400 A * | 10/1995 | Ahmad et al. ............... | 324/763 |
| 6,084,482 A * | 7/2000 | Nakamura ................... | 331/44 |
| 6,353,563 B1 * | 3/2002 | Hii et al. .................... | 365/201 |
| 6,456,223 B1 * | 9/2002 | Yu et al. ..................... | 341/161 |
| 6,654,905 B1 * | 11/2003 | Dickens ...................... | 714/10 |
| 6,664,799 B2 * | 12/2003 | Lovett ........................ | 324/765 |
| 6,853,177 B2 * | 2/2005 | Shibayama et al. ....... | 324/76.48 |
| 6,857,093 B2 * | 2/2005 | Ooishi ........................ | 714/733 |

FOREIGN PATENT DOCUMENTS

| | | |
|---|---|---|
| JP | 11-339467 | 12/1999 |
| KR | 1020000044680 | 7/2000 |
| KR | 1020020096471 | 12/2002 |

* cited by examiner

*Primary Examiner*—Ha Tran Nguyen
*Assistant Examiner*—Arleen M. Vazquez
(74) *Attorney, Agent, or Firm*—Lowe Hauptman Ham & Berner LLP

(57) ABSTRACT

There is provided an on-chip test circuit that is capable of measuring validity of an output signal within a chip without any external measuring device. The on-chip self test circuit implemented on the same chip as a test semiconductor device includes: a test load block for receiving a test target signal; and a self test block for receiving a test target signal passing through the test load block and a test target signal inputted to an output driver together, and determining whether a change of the test target signal is within an allowable range. Accordingly, the validity of the signal outputted from the device can be measured without any expensive external measuring device. Also, when the test must be done before the packaging stage, the test can be simply performed, thereby reducing the test cost greatly.

24 Claims, 9 Drawing Sheets

ON-CHIP SELF TEST CIRCUIT AND SELF TEST METHOD FOR SIGNAL DISTORTION

FIELD OF INVENTION

The present invention relates to a test circuit implemented on a chip; and, more particularly, to an on-chip test circuit that is capable of measuring a window of a signal without any connection to an external measuring device.

DESCRIPTION OF PRIOR ART

A general method for guaranteeing a correct operation of a memory device is to measure a window of output signals. The window is an important factor for synchronizing an external device with data input/output.

Since a window of an output signal in a conventional memory device is measured by simply connecting an output pad to an external test device, the window measurement of the output signal requires a lot of time and a lot of man-power/physical cost. Specifically, when an unpackaged chip is sold, the window measurement is performed in a wafer level. However, in order to monitor a radio frequency (RF) output in the wafer level, expensive equipment having a small self-load is required.

SUMMARY OF INVENTION

It is, therefore, an object of the present invention to provide an on-chip self test circuit and a signal distortion self test method, which are capable of measuring validity of an output signal within a chip without any external measuring device.

In accordance with an aspect of the present invention, there is provided a mismatch test circuit for measuring a mismatch between a first input signal and a second input signal, the mismatch test circuit including: a sampling pulse oscillating unit for generating a sampling pulse enabled at constant period; and a similarity determining unit for determining a similarity between the first input signal and the second input signal at an enabling timing of the sampling pulse.

In accordance with another aspect of the present invention, there is provided an on-chip self test circuit implemented on the same chip as a test semiconductor device, the on-chip self test circuit including: a test load block for receiving a test target signal; and a self test block for receiving a test target signal passing through the test load block and a test target signal inputted to an output driver together, and determining whether a change of the test target signal is within an allowable range.

In accordance with a further another aspect of the present invention, there is provided a signal distortion self test method, including the steps of: generating a sampling pulse; generating a strobe signal by sampling a test target signal, which does not pass through a test load, according to the sampling pulse; generating a mismatch result signal by determining whether a test target signal passing through the test load inputted at a timing when the strobe signal is generated is identical to the strobe signal; and converting the mismatch result signal into a bit data sequence.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, the preferred embodiments of the present invention will be described in detail referring to the accompanying drawings.

The present invention provides an on-chip self test circuit having a self test block and a test load on a target chip. Accordingly, the one-chip self test circuit can measure window of data output signal so as to measure a validity of an enable window of specific signal or synchronization validity.

Figure 1:
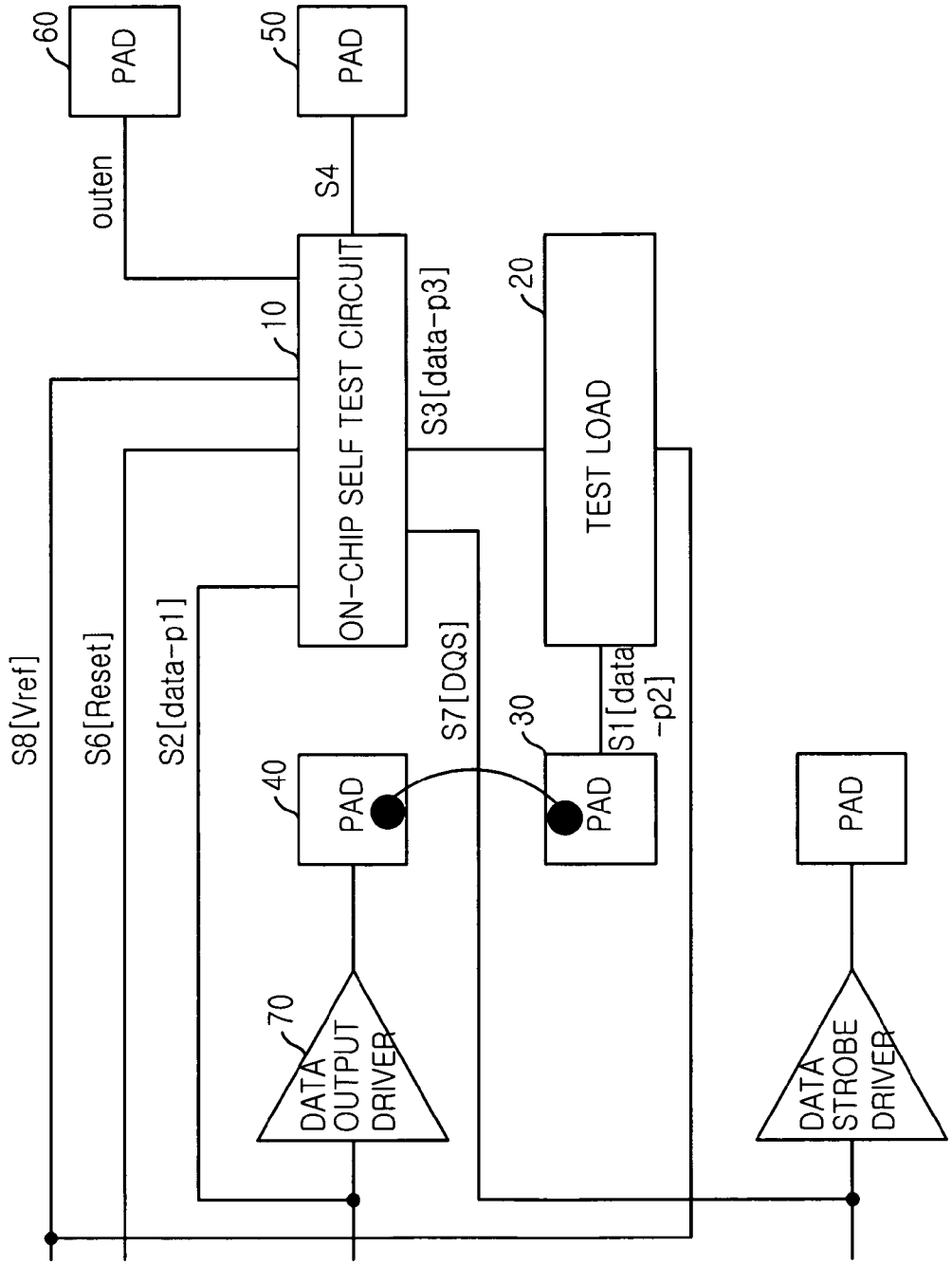
FIG. 1 is a block diagram of an on-chip self test circuit in accordance with an embodiment of the present invention.

FIG. 1 is a block diagram of an on-chip self test circuit in accordance with an embodiment of the present invention. In FIG. 1, a self test block 10 is a circuit block that measures a window validity of a test target signal, and a test load block 20 is a block that is implemented inside a chip so as to provide a circuit component similar to a case where it is connected to an external chip.

In this embodiment, an on-chip self test circuit may further include a selecting unit for selecting a test target signal among several signals outputted in driving a semiconductor chip. As shown in FIG. 1, the selecting unit can be implemented with a test signal input pad 30 for receiving a test target signal inputted to the test load block 20. The test target signal can be selected by bonding the test signal input pad 30 with an output pad 70 through which the test target signal is outputted.

The on-chip self test circuit may further include a test command pad 60 for receiving an external test command outen, and a test result outputting pad 50 for outputting a test result S4 to an external circuit. Although not shown, the on-chip self test circuit may further include a sample signal input pad for receiving a sample signal S5.

The on-chip self test circuit can receive a signal for activation determination of a test target signal from main chip components depending on kinds of the test target signal. Also, the on-chip self test circuit can receive a reference voltage for execution of operation or an operation clock clk for execution of test from the main chip components.

Figure 2:
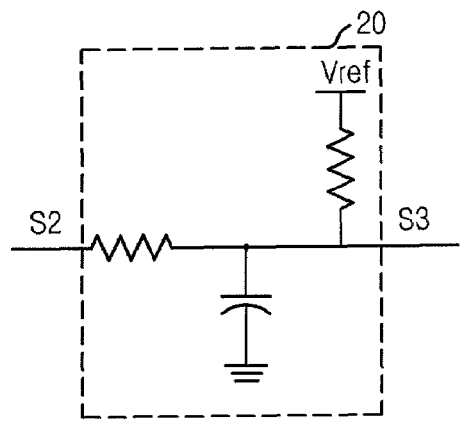
FIG. 2 is a circuit diagram of a test load block shown in FIG. 1.

FIG. 2 is a circuit diagram of the test load block 20 shown in FIG. 1. In FIG. 2, the test load block is implemented with a test load of SSTL level.

Figure 3:
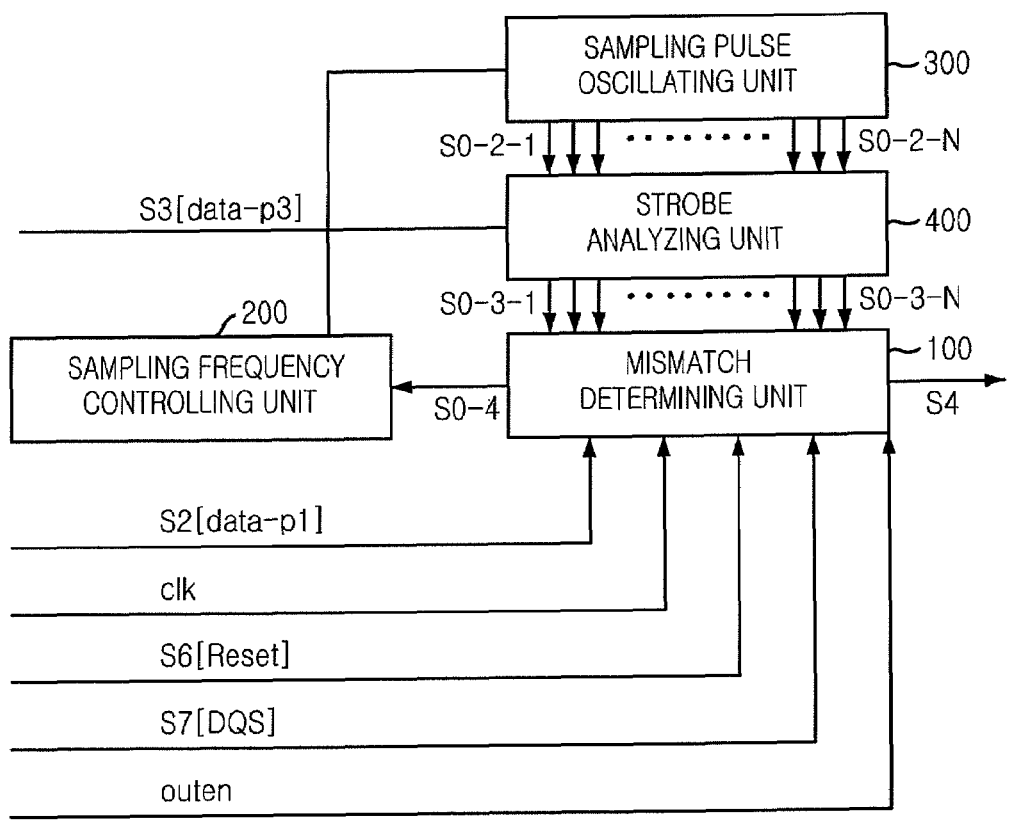
FIG. 3 is a block diagram of a self test block shown in FIG. 1.

FIG. 3 is a block diagram of the self test block 10 shown in FIG. 1.

Referring to FIG. 3, the self test block 10 includes a sampling pulse oscillating unit 300, a sampling frequency controlling unit 300, a strobe analyzing unit 400, and a mismatch determining unit. The sampling pulse oscillating unit 300 generates a sampling pulse S0-2 of which frequency is changing depending on a control signal. The sampling frequency controlling unit 200 controls an oscillation frequency of the sampling pulse oscillating unit 300. The strobe analyzing unit 400 determines a logic state of a test target signal when the sampling pulse is generated. The mismatch determining unit 100 determines validity of data window according to the result vale of the strobe analyzing unit 400.

Figure 4A:
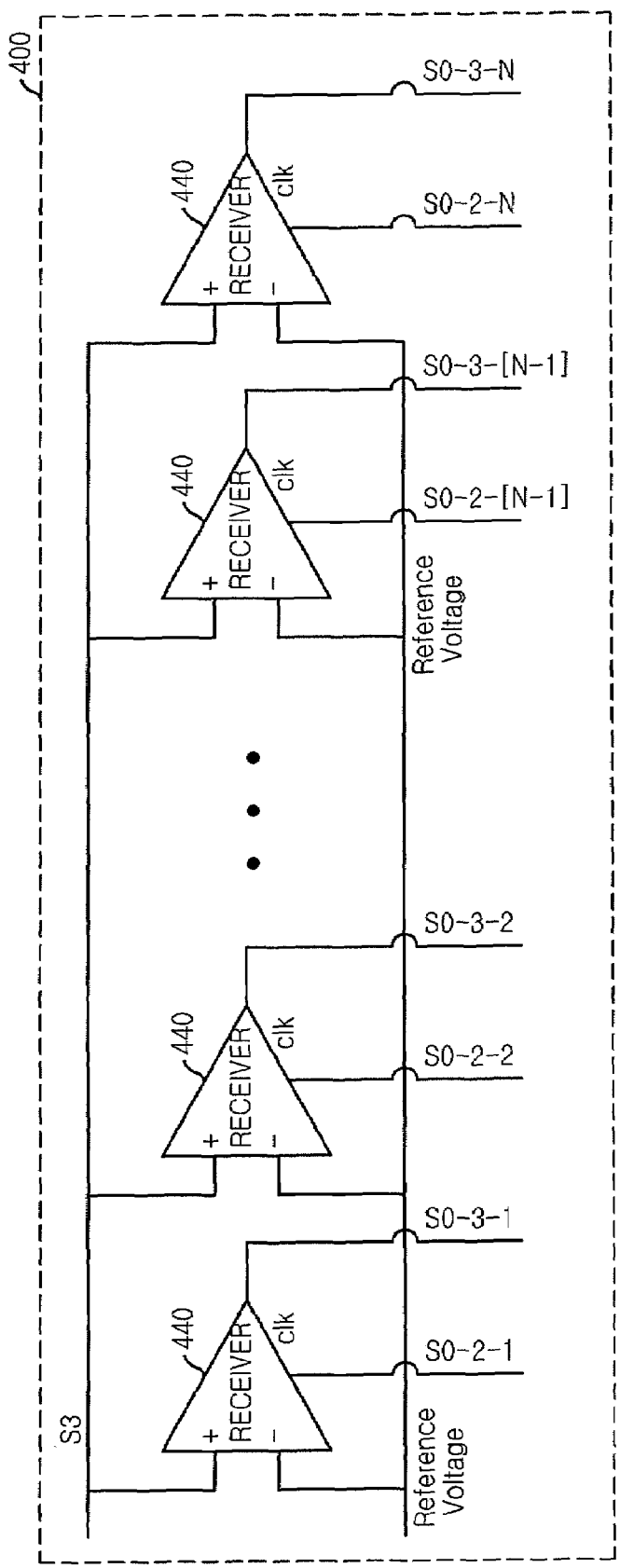
FIG. 4A is a circuit diagram of a strobe analyzing unit shown in FIG. 3.
Figure 4B:
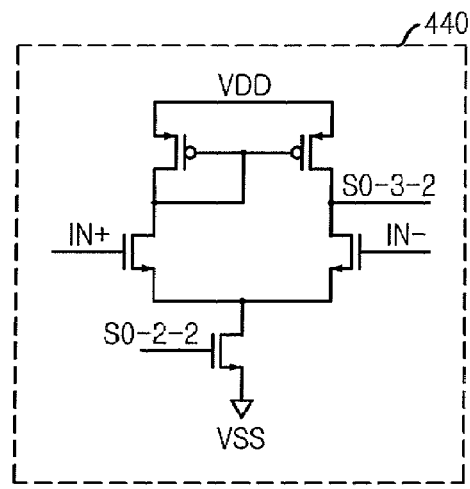
FIG. 4B is a circuit diagram of a comparator shown in FIG. 4A.

FIG. 4A is a circuit diagram of the strobe analyzing unit 400 shown in FIG. 3. The strobe analyzing unit 400 includes comparators 440 as many as the number of the sampling pulses S0-2 and performs a parallel process. Also, the strobe analyzing unit 400 can be implemented with a serial processing structure such that comparison operation is performed at each input of the sampling pulse S0-2 by using only one comparator.

Each comparator 440 of the strobe analyzing unit 400 can be configured to receive sampling pulse S0-2, test target signal S3 (or sample signal S5), and reference voltage. When the sampling pulse S0-2 is in a logic high level, the comparator 440 compares the test target signal S3 and the reference voltage. A set of result values of the respective comparators 440 are strobe analysis signal S0-3 and are sequentially outputted one bit by one bit through parallel line.

Figure 5B:
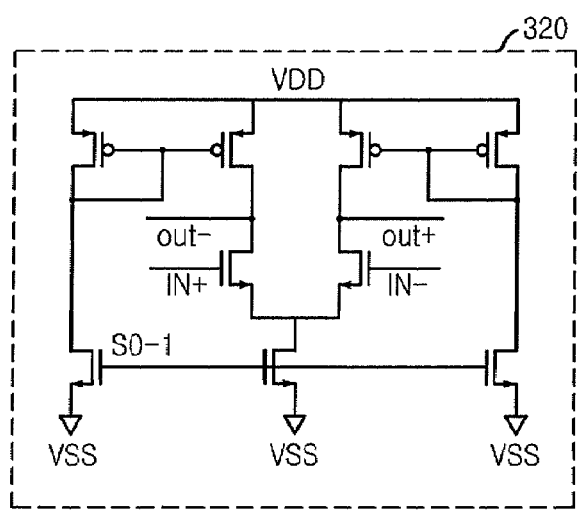
FIG. 5B is a circuit diagram of an oscillator shown in FIG. 5A.
Figure 5C:
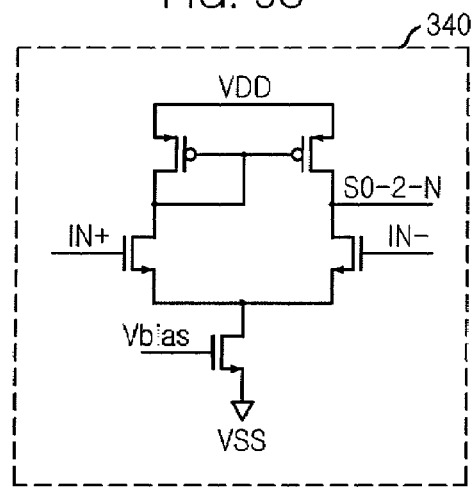
FIG. 5C is a circuit diagram of a sampling pulse driver shown in FIG. 5A.
Figure 5A:
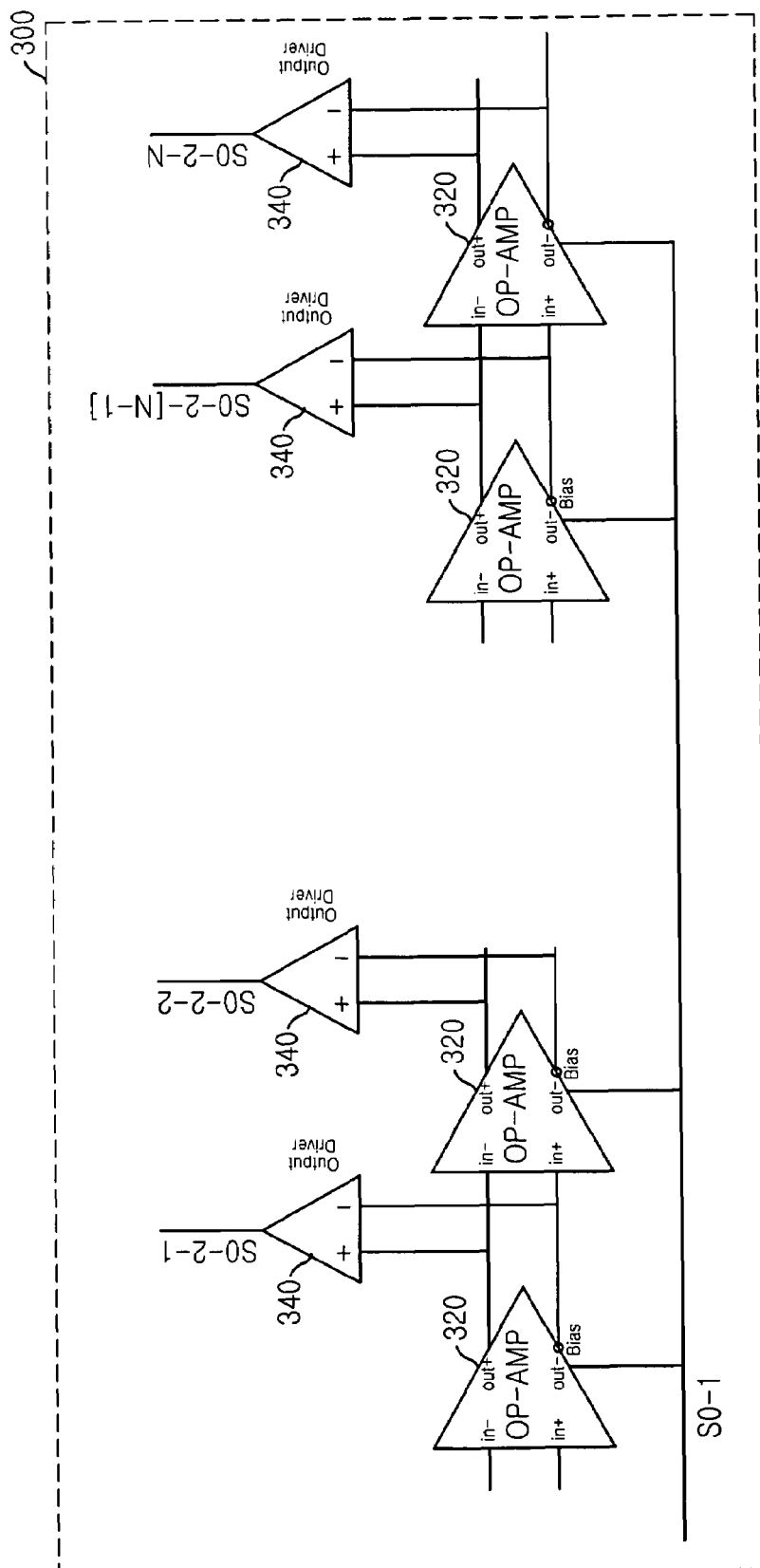
FIG. 5A is a circuit diagram of a sampling pulse oscillator shown in FIG. 3.

FIG. 5A is a circuit diagram of the sampling pulse oscillating unit shown in FIG. 3.

Referring to FIG. 5A, the sampling pulse oscillating unit 300 includes N oscillators 320 and N drivers 340. The N oscillators 320 connected in cascade receive transition of a previous oscillator and transit an output. A transition delay time of the oscillator is controlled depending on the frequency control signal. The N drivers 340 drive output of the oscillators to output the sampling pulse bits S0-2-1 to S0-2-N.

Meanwhile, the sampling pulse oscillating unit 300 includes the oscillators 320 as many as the number of the sampling pulses S0-2 and generates the sampling pulses S0-2 in parallel. Also, the sampling pulse bits S0-2-1 to S0-2-N can be generated in series using one oscillator 320. The sampling pulse oscillating unit 300 generates a first sampling pulse bit S0-2-1 enabled at the first oscillator 320 after a predetermined time elapses from a time point when the sampling pulse is generated, and generates a second sampling pulse bit S0-2-2 enabled at the second oscillator 320 after the same time elapses from a time point when the first sampling pulse bit S0-2-1 is enabled. In the same manner, the sampling pulses S0-2 are outputted through N bus lines by the sampling pulse oscillating unit 300.

Each oscillator 320 of the sampling pulse oscillating unit 300 has two input terminals and two output terminals and receives the frequency control voltage S0-1. In the oscillator 320, signal pairs of the output terminal are reverse to signals pairs of the input terminal. A delay time from the signal receiving time to the signal outputting time is determined by the frequency control voltage S0-1 inputted to the bios transistor.

As shown in FIG. 5C, each driver 340 of the sampling pulse oscillating unit 300 has a differential amplifier structure having two input terminals and one output terminal. Though the output signal of the oscillator 320 can be directly outputted as the sampling pulse S0-2 without any driver, it is preferable that the driver is provided for preventing instability of the oscillation clock due to the change in load of the oscillator 320.

Figure 6:
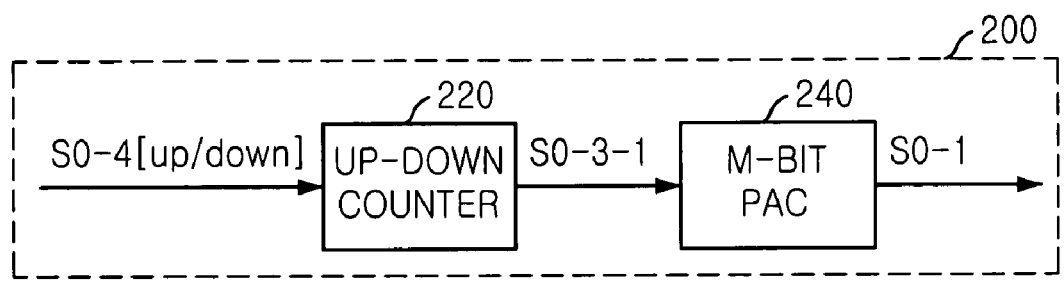
FIG. 6 is a block diagram of a sampling frequency controlling unit shown in FIG. 3.

FIG. 6 is a block diagram of the sampling frequency controlling unit shown in FIG. 3.

Referring to FIG. 6, the sampling frequency controlling unit 200 controls potential of the frequency control voltage depending on the result of the mismatch determining unit 100. The mismatch determining unit 100 outputs the determination result in a form of serial logic values. Therefore, the sampling frequency controlling unit 200 can include a counter 220 for counting the determination result of the mismatch determining unit 100, and a digital-to-analog converter 240 for generating an output signal having a potential corresponding to the counted value. The sampling frequency controlling unit 200 operates when the sample signal is inputted, and stops when the test target signal is inputted.

Figure 7B:
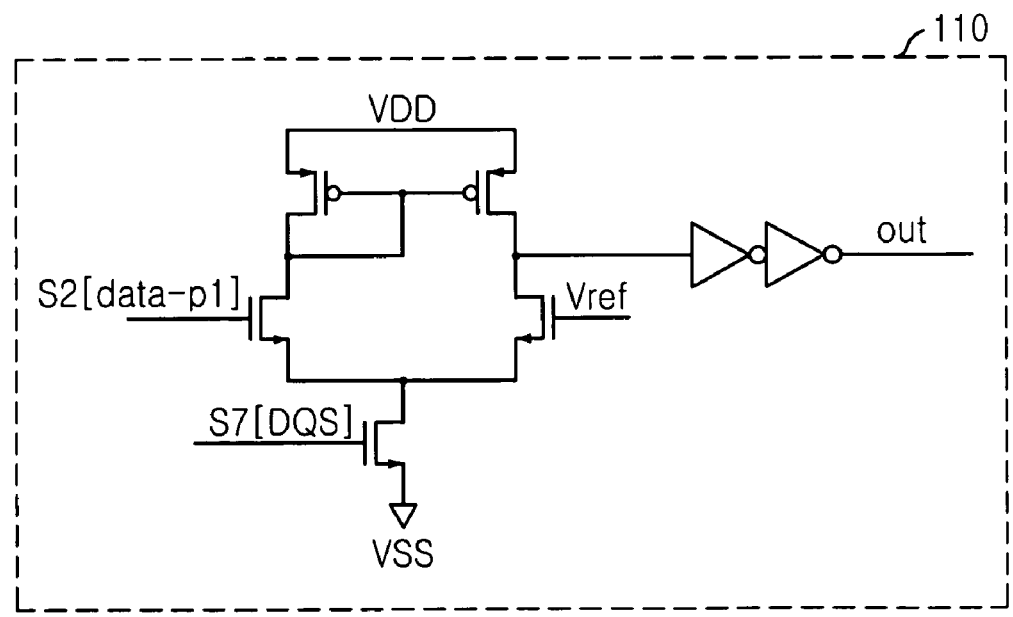
FIG. 7B is a circuit diagram of a test result outputting unit shown in FIG. 7A.
Figure 7A:
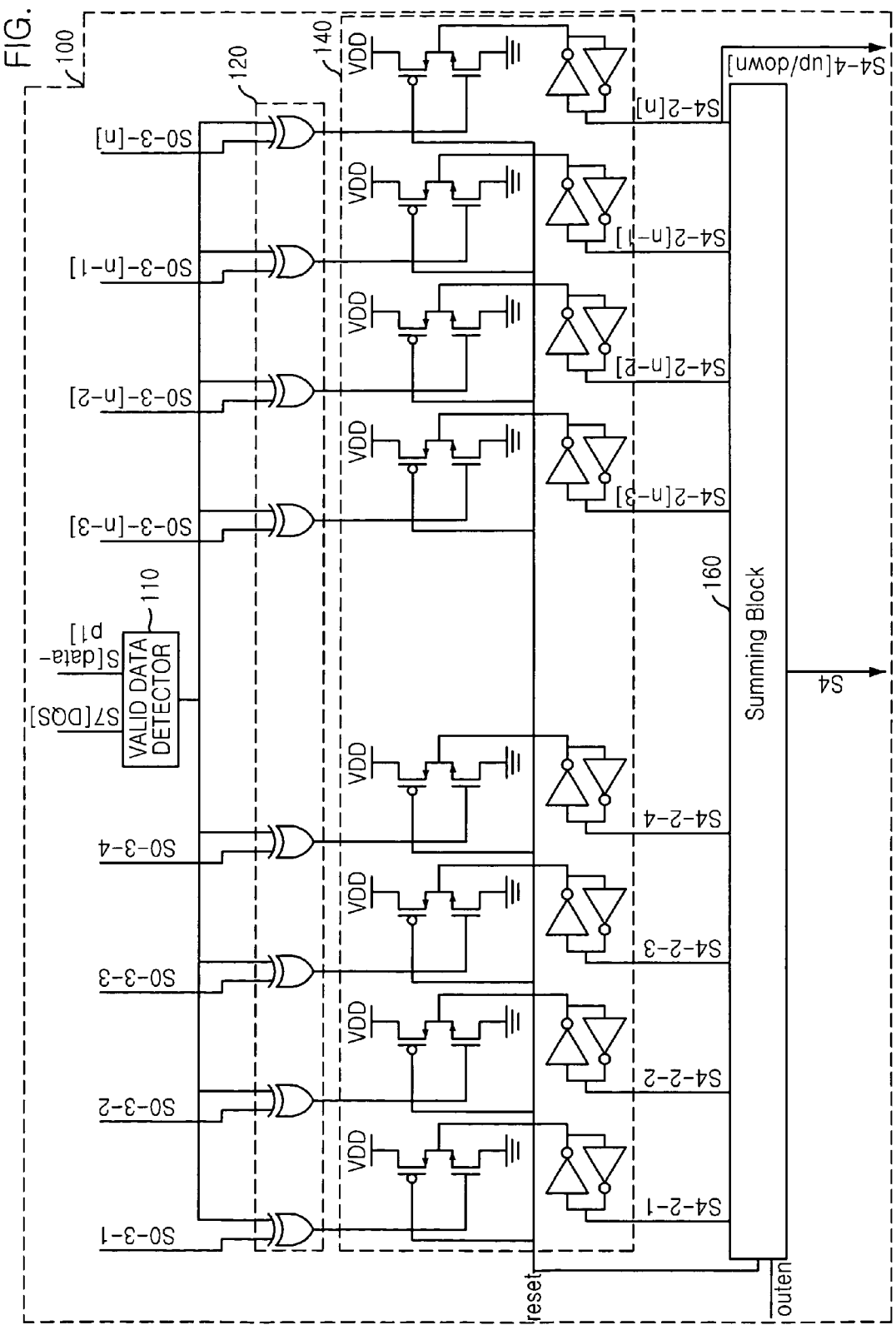
FIG. 7A is a circuit diagram of a mismatch determining unit shown in FIG. 3.

FIG. 7A is a circuit diagram of the mismatch determining unit shown in FIG. 3

Referring to FIG. 7A, the mismatch determining unit 100 includes an XOR gate array 120, a latch array 140, and a test result outputting unit 160. The XOR gate array 120 is configured with N XOR gates for performing an XOR operation on the strobe signal bits and the second input signal. The latch array 140 latches the results of the XOR gate array 120. The test result outputting unit 160 outputs the values latched in the latch array in a form of binary data sequence. The mismatch determining unit 100 receives the strobe signals S0-3, which are results given by sampling the inputted test target signals using the current sampling frequency, and compares the strobe signals S0-3 with previous signals of the data output driver 70, and then outputs test result data S4 indicating offset degree.

The strobe signals S0-3 are inputted to the XOR gate array 120 for determining error allowance, and the signals S2 pass through a valid data detector 110. The valid data detector 110 shown in FIG. 7B has a differential amplifier structure that is driven depending on the control of the data strobe signal DQS (S7), and thus determines the logic values of the signals S2. Also, in high state of the data strobe signal DQS, that is, during the activation period of the data strobe signal DQS, the valid data detector 110 transfers the signals S2 to the inside. The valid data detector 110 is provided for guarantee the validity of the data signal where separate strobe signal exists. When the present invention is applied to the signal distortion test on the signal having no separate strobe signal, it is apparent that the valid data detector 110 can be omitted.

In order to match the timing, the strobe signals S0-3 can be inputted to the XOR gate array 120 through a predetermined delay unit. After a calibration process, which will be described late, a first bit S0-3-1 and a last bit S0-3-N of the strobe signal have a low value, and bits S0-3-2 to S0-3-[N–

1] of the remaining strobe signals have a high value. When there is no error due to the output driver and the test load, a high transition of the signal S2 occurs between an input time point of the first bit S0-3-1 and an input time point of the second bit S0-3-2, and a low transition of the signal S2 occurs between an input time point of the (N−1)-th bit S0-3-2 and an input time point of a last bit S0-3-N. Accordingly, in the ideal case, all output signals of the XOR gate array 120 become low. On the contrary, as the offset between the signal S3 passing through the test load and the signal S2 prior to the test load is greater, the number of XOR gate outputting high level among the XOR gate array 120 is increasing.

The strobe signal bits S0-3-1 to S0-3-N are activated for a short time and are floating for the remaining period. Therefore, it is preferable that the latch array 140 is provided to latch the output signals of the XOR gate array 120. The latch array 40 is provided N latch units, and each latch unit includes: a PMOS transistor and an NMOS transistor connected in an inverter type; and a 2-inverter latch connected to an output terminal of the inverter. A reset signal is inputted to a gate of the PMOS transistor and an XOR gate output is connected to a gate of the NMOS transistor.

Figure 7C:
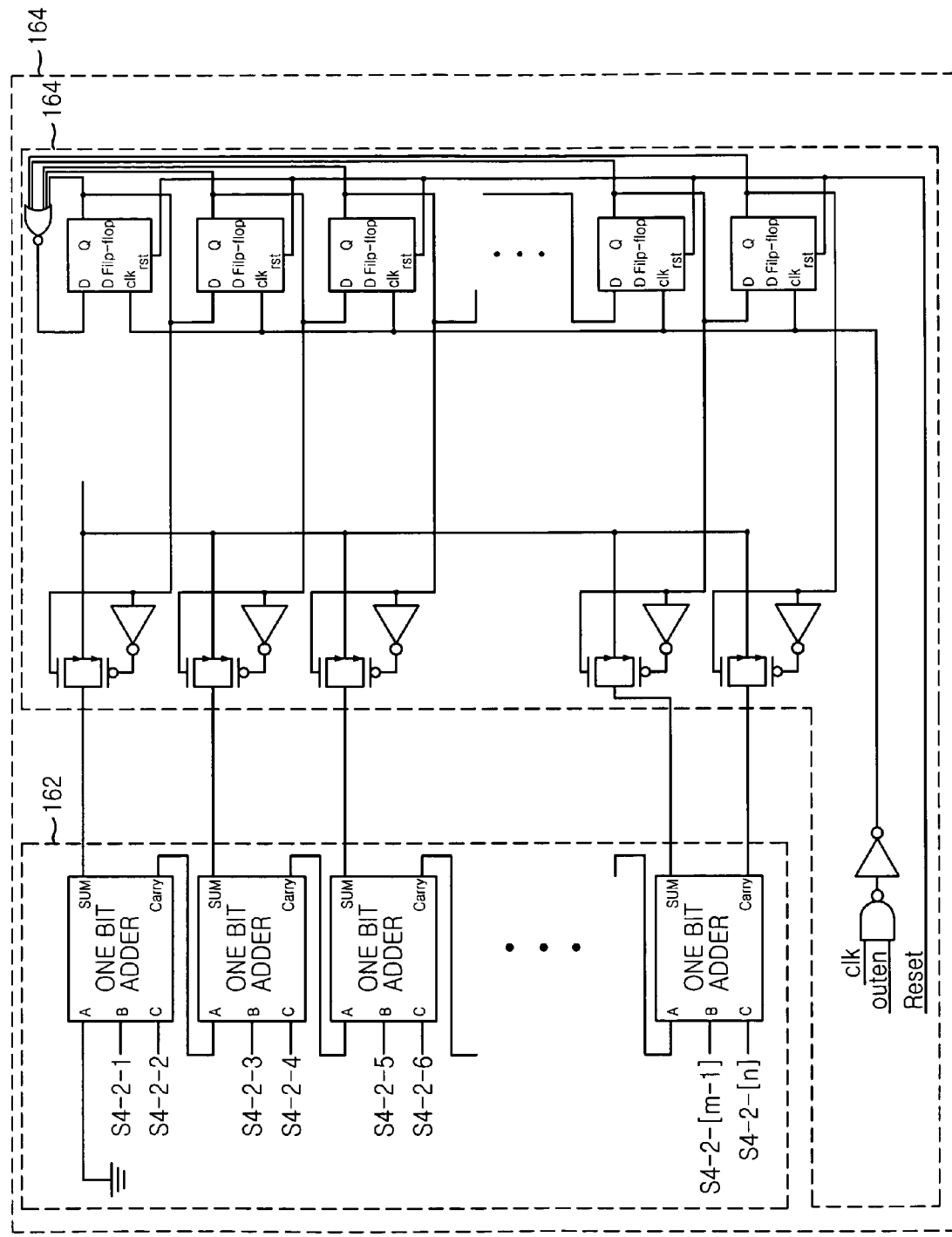
FIG. 7C is a circuit diagram of a valid signal detector shown in FIG. 7A.

The test result outputting unit 160 receives the mismatch result signal S4-2 to output the test result data S4. Since the number of the output pins in the test circuit is limited, it is preferable to output the test result data in a serial data. As shown in FIG. 7C, the test result outputting unit 160 can be implemented to output bit data sequences of binary number representing a total number of the mismatch result signal bits S4-2-1 to S4-2-N having a high value. Alternatively, the test result outputting unit 160 can be implemented to simply output bit data sequences in a string of the mismatch result signals S4-2. The former has an advantage that can output the test result within a fast time, and the latter has an advantage that can express signal distortion degree and distortion pattern information.

The test result outputting unit 160 shown in FIG. 7C includes a summing unit 162 for summing the mismatch result signals S4-2 to generate binary values, and a serial output unit 164 for outputting the summed binary values as serial bit data. The summing unit 162 can be implemented with the n/2 number of CSA (carry save adder) summers receiving three bit data. The serial output unit 164 is implemented with the n/2 number of flip-flops that are activated in a cycle according to the output operation clock. The sum of the CSA summers representing each digit of the summed binary values is outputted.

Hereinafter, a signal distortion test process using the test circuit will be described below.

Figures 8A, 8B:
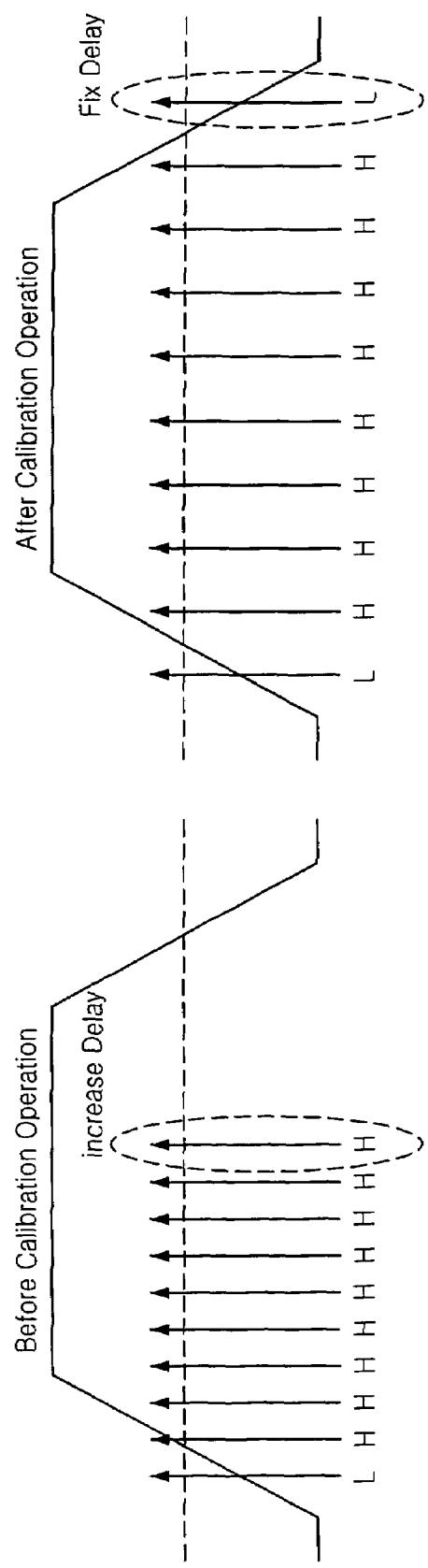
FIG. 8A is a timing diagram illustrating a relationship between a sample signal and a sampling pulse before calibration operation.
FIG. 8B is a timing diagram illustrating a relationship between a sample signal and a sampling pulse before calibration operation.

It is preferable that the sampling time in the strobe analyzing unit 400 includes the activated period of the test target signal. For this, as shown in FIGS. 8A and 8B, the sampling pulse frequency generated by the sampling pulse oscillating unit 300 must be adjusted. To adjust the sampling pulse frequency is called a calibration operation. The calibration operation includes the steps of: setting the oscillation frequency to the maximum value and generating a sampling pulse (S110); receiving a sample frequency (S120); setting the sample signal to the sampling pulse and generating the strobe signal (S140); determining a logic value of a last bit of the strobe signal (S160); and decreasing or increasing the oscillation frequency to generate a sampling pulse according to the determination of the step S160, and returning to the step S120. The calibration operation is completed by repeating the steps S120 to S180 for a sufficient time.

In the structure of FIG. 1, the calibration operation is performed by applying the sample signal S5 to the test input pad in such a state that the output pad 40 for the test target signal and the input pad 30 for the test signal are not connected together. The sampling pulse is generated with the maximum oscillation frequency (S110), and the sample signal S5 is inputted to the self test block 10 through the test load 20 over the path of the S3 signal (S120).

In the structure of FIG. 3, the sampling pulse S0-2 is outputted from the sampling pulse oscillating unit 300 with a frequency according to the signal S0-1 initially outputted from the sampling frequency controlling unit 200 and it is inputted to the strobe analyzing unit 400. The strobe analyzing unit 400 performs a sampling operation on the sample signal S5 based on the sampling pulse S0-2 (S140).

The output of the last oscillator can be applied to (+)/(−) input terminals of the first oscillator in the sampling pulse oscillating unit 300, and an oscillation starting unit (not shown) can be further included for applying the oscillation starting signal to the input terminal of the first oscillator. In the latter case, the sampling timing can be controlled by adjusting the timing of applying the oscillation starting signal.

Using the data strobe signal DQS or delaying the sample signal S5 inputted to the strobe analyzing unit 400 (however, the signal S5 is delayed by a predetermined time due to the test load block without any separate delay unit), the first sampling can be adjusted such that it is performed just before the sample signal S5 transits to a high state. Accordingly, the first strobe signal bit S0-3-1 has a low value. On the contrary, since the frequency of the sampling pulse is sufficiently high in the driving, the last strobe signal bit S0-3-N has a high value as the sampling result when the sampling signal S5 is in a high transition state.

Meanwhile, when the calibration operation is performed, a high value is applied as the S2 value. In the structure of FIG. 7, the valid data detector 110 receiving a high value of S2 outputs the waveform of the data strobe signal S7 as it is. When the signal having no separate strobe signal is tested or the sampling timing in the calibration is dependent on the sample signal, a high value can be also applied to the strobe signal input terminal of the valid data detector 110.

In the step S160, the output S4-2-N of the last array of the latch array in the calibration operation has a low value according to the signal S0-3-N of a high value and the high output of the valid data detector. The signal S0-3-N of a low value is inputted to the counter 220 of the sampling frequency controlling unit 200 to decrease the counting value. The decreased counting value decreases the voltage of the sampling control signal S0-1 outputted from the D/A converter 240. If the voltage of the sampling control signal S0-1 applied to the sampling pulse oscillating unit 300 decreases, the driving current amount of the oscillator shown in FIG. 5B also decreases. This leads to the slow speed of the oscillator, and the frequency of the sampling pulse S0-2 is reduced (S180).

The process of gradually reducing the frequency of the sampling pulse S0-2 is repeated until the last strobe signal S0-3-N becomes a low value. If the calibration operation is performed satisfactorily since a sufficient time elapses, the applying of the test signal is stopped and the test signal input pad 30 is connected to the pad 40 through which the signal to be tested is outputted. The test command signal outen applied to the test command pad 60 is enabled. As shown in FIG. 7C, the enabled test command signal outen activates the test result outputting unit 160. The sampling control signal S0-1 inputted to the counter 220 of the sampling frequency controlling unit is interrupted to fix the counting value of the counter 220.

When the calibration operation is finished, the test for the signal delay allowable error is performed. In this case, as shown in FIG. 1, the bonding connection is performed, and the test target signal S2, the data strobe signal S7 and the test target signal S3 are inputted to the sample test block 10. In this state, the signal distortion self test method includes the steps of: generating the sampling pulse (S200); generating the strobe signal by sampling the test target signal, which does not pass through the test load, according to the sampling pulse (S400); generating the mismatch result signal by determining whether the test target signal passing through the test load is identical to the strobe signal (S600); and converting the mismatch result signal into the bit data sequence (S800).

The sampling pulse oscillating unit 300 generates the sampling pulse S0-2 using the frequency fixed by the calibration operation (S200), and the strobe analyzing unit 400 samples the test target signal S3 according to the sampling pulse S0-2 and outputs it as the strobe signal S0-3 (S400).

The valid data detector 110 of the mismatch determining unit 100 detects the valid signal occurring during the enable period of the data strobe signal DQS as the test target signal S2 before the data output driver 70. The valid data is a reference signal in determining the test target signal S3.

Every when the strobe signal bits S0-3-1 to S0-3-N are inputted one by one, the strobe analyzing unit 400 performs an XOR operation on the valid signal of the input timing and the strobe signal bits and the result is latched in the latch of the latch array 140 and is outputted to the test result outputting unit 160 (S600).

The test result outputting unit 160 receives the XOR operation result latched in the latch array 140 and outputs the number of the bits of high value (that is, the sampling timing where the test target signal S3 and the signal S2 have the different logic value) as the test result signal S4 (S800) Instead of the structure of FIG. 7C, the structure that outputs the XOR operation result as it is can be provided.

The test result signal S4 is transferred through the test output pad 50 to the outside, thereby enabling the test operator to monitor it. The test operator determines whether the distortion of the test target signal is within the allowable error by checking the number of the sampling timing where the test target signal S3 and the signal S2 have the different logic value.

According to the present invention, the validity of the signal outputted from the device can be measured without any expensive external measuring device.

Also, when the test must be done before the packaging stage, the test can be simply performed, thereby reducing the test cost greatly.

The present application contains subject matter related to Korean patent application No. 2004-88841, filed in the Korean Patent Office on Nov. 3, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A mismatch test circuit for measuring a mismatch between a first input signal and a second input signal, the mismatch test circuit comprising:

a sampling pulse oscillating unit for generating a sampling pulse enabled at constant period; and a similarity determining unit for determining a similarity between the first input signal and the second input signal at an enabling timing of the sampling pulse, wherein the similarity determining unit includes:

a strobe analyzing unit for generating strobe signals including logic values given by sampling the first input signal at the enabling timing of the sampling pulse; and a mismatch determining unit for determining whether a logic value of the second input signal at a timing when the strobe signal is generated is identical to a logic value of a current strobe signal, wherein the sampling pulse includes N sampling pulse bits enabled at predetermined intervals according to an input of the first or second input signal, and the sampling pulse oscillating unit includes:

N oscillators connected in cascade, for receiving transition of a previous oscillator and transiting an output, a transition delay time of the oscillator being controlled depending on the frequency control signal; and N drivers for driving outputs of the oscillators to output the sampling pulse bits.

2. The mismatch test circuit as recited in claim 1, further comprising a sampling frequency controlling unit for outputting a frequency control signal to control an oscillation frequency of the sampling pulse.

3. The mismatch test circuit as recited in claim 2, wherein the mismatch determining unit includes: an XOR gate array including N XOR gates for performing an XOR operation on the strobe signal bit and the second input signal; a latch array for latching a result of the XOR gate array; and a test result outputting unit for outputting the latched value of the latch array in a form of binary data sequence.

4. The mismatch test circuit as recited in claim 3, wherein the mismatch determining unit further includes a valid signal detector for receiving data strobe signal and the second input signal, generating a valid signal dependent of a logic state of the second input signal at an enable period of the data strobe signal, and outputting the data strobe signal to the XOR gates.

5. The mismatch test circuit as recited in claim 4, wherein the valid signal detector is a differential amplifier for amplifying a potential difference between reference voltage and the second input signal and outputting a logic value as a valid signal, a flow path of a driving current being switched according to the data strobe signal.

6. The mismatch test circuit as recited in claim 1, wherein the oscillator is a 2-port differential amplifier for amplifying a potential difference of two input terminals, a driving current amount being controlled depending on the frequency control signal.

7. The mismatch test circuit as recited in claim 1, wherein the strobe signal is composed of N strobe signal bits, and the strobe analyzing unit includes comparators for receiving the sampling pulse bits one by one and outputting the strobe signal bits as the logic value of the first input signal determined at the enabling timing of the inputted sampling pulse bit.

8. The mismatch test circuit as recited in claim 7, wherein the comparator is a differential amplifier for amplifying a potential difference between the first input signal and a reference voltage to output the strobe signal bit, a flow path of a driving current being switched according to the sampling pulse bits.

9. The mismatch test circuit as recited in claim 8, wherein the latch array includes: PMOS transistor and NMOS transistor connected in an inverter type, the PMOS transistor having a gate receiving a reset signal, the NMOS transistor having a gate connected to an output of the XOR gate; and N latch units including 2-inverter latch connected to an output terminal of the inverter.

10. The mismatch test circuit as recited in claim 8, wherein the test result outputting unit outputs a string of binary values latched in the latch array in a bit data sequence.

11. The mismatch test circuit as recited in claim 8, wherein the test result outputting unit outputs a binary number given by summing the latched binary values as the bit data sequence.

12. The mismatch test circuit as recited in claim 11, wherein the test result outputting unit includes: a summing unit for summing the latched values to generate the binary value; and a serial output unit for outputting the summed binary value as the bit data sequence.

13. A mismatch test circuit for measuring a mismatch between a first input signal and a second input signal, the mismatch test circuit comprising:
a sampling pulse oscillating unit for generating a sampling pulse enabled at constant period; and
a similarity determining unit for determining a similarity between the first input signal and the second input signal at an enabling timing of the sampling pulse, wherein the similarity determining unit includes:
a strobe analyzing unit for generating strobe signals including logic values given by sampling the first input signal at the enabling timing of the sampling pulse; and
a mismatch determining unit for determining whether a logic value of the second input signal at a timing when the strobe signal is generated is identical to a logic value of a current strobe signal,
wherein the mismatch determining unit includes:
an XOR gate array including N XOR gates for performing an XOR operation on the strobe signal bit and the second input signal;
a latch array for latching a result of the XOR gate array; and
a test result outputting unit for outputting the latched value of the latch array in a form of binary data sequence.

14. The mismatch test circuit as recited in claim 13, further comprising a sampling frequency controlling unit for outputting a frequency control signal to control an oscillation frequency of the sampling pulse.

15. The mismatch test circuit as recited in claim 13, wherein the sampling pulse oscillating unit includes:
N sampling pulse bits enabled at predetermined intervals according to an input of the first or second input signal;
N oscillators connected in cascade, for receiving transition of a previous oscillator and transiting an output, a transition delay time of the oscillator being controlled depending on the frequency control signal; and
N drivers for driving outputs of the oscillators to output the sampling pulse bits.

16. The mismatch test circuit as recited in claim 15, wherein the oscillator is a 2-port differential amplifier for amplifying a potential difference of two input terminals, a driving current amount being controlled depending on the frequency control signal.

17. The mismatch test circuit as recited in claim 15, wherein the strobe signal is composed of N strobe signal bits, and the strobe analyzing unit includes comparators for receiving the sampling pulse bits one by one and outputting the strobe signal bits as the logic value of the first input signal determined at the enabling timing of the inputted sampling pulse bit.

18. The mismatch test circuit as recited in claim 17, wherein the comparator is a differential amplifier for amplifying a potential difference between the first input signal and a reference voltage to output the strobe signal bit, a flow path of a driving current being switched according to the sampling pulse bits.

19. The mismatch test circuit as recited in claim 13, wherein the mismatch determining unit further includes a valid signal detector for receiving data strobe signal and the second input signal, generating a valid signal dependent of a logic state of the second input signal at an enable period of the data strobe signal, and outputting the data strobe signal to the XOR gates.

20. The mismatch test circuit as recited in claim 19, wherein the valid signal detector is a differential amplifier for amplifying a potential difference between reference voltage and the second input signal and outputting a logic value as a valid signal, a flow path of a driving current being switched according to the data strobe signal.

21. The mismatch test circuit as recited in claim 13, wherein the latch array includes:
PMOS transistor and NMOS transistor connected in an inverter type, the PMOS transistor having a gate receiving a reset signal, the NMOS transistor having a gate connected to an output of the XOR gate; and
N latch units including 2-inverter latch connected to an output terminal of the inverter.

22. The mismatch test circuit as recited in claim 13, wherein the test result outputting unit outputs a string of binary values latched in the latch array in a bit data sequence.

23. The mismatch test circuit as recited in claim 22, wherein the test result outputting unit includes:
a summing unit for summing the latched values to generate the binary value; and
a serial output unit for outputting the summed binary value as the bit data sequence.

24. The mismatch test circuit as recited in claim 13, wherein the test result outputting unit outputs a binary number given by summing the latched binary values as the bit data sequence.

* * * * *